United States Patent [19]

Martinez et al.

[11] Patent Number: 5,048,807
[45] Date of Patent: Sep. 17, 1991

[54] CLAMPING TOOL FOR CARRYING OUT A CHEMICAL VAPOR INFILTRATION OF A MATERIAL WITHIN A FIBROUS PREFORM DURING THE MANUFACTURE OF COMPOSITE PARTS

[75] Inventors: Manuel Martinez, Merignac; Francis Bouvier, Bordeaux, both of France

[73] Assignee: Societe Europeenne de Propulsion, Suresnes, France

[21] Appl. No.: 550,318

[22] Filed: Jul. 9, 1990

[30] Foreign Application Priority Data

Jul. 11, 1989 [FR] France ................. 89 09336

[51] Int. Cl.⁵ ............................................. B25B 1/10
[52] U.S. Cl. .................................... 269/243; 269/286
[58] Field of Search ................ 269/257, 46, 243, 287, 269/285, 909, 273, 274, 286; 29/281.1

[56] References Cited

U.S. PATENT DOCUMENTS

| | | | |
|---|---|---|---|
| 1,878,850 | 9/1932 | Hilgers | 269/257 |
| 2,542,719 | 2/1951 | Sprague | 269/243 |
| 2,684,525 | 7/1954 | Dominguez | 269/46 |
| 3,991,248 | 11/1976 | Bauer . | |
| 4,824,066 | 4/1989 | Smith | 269/243 |

FOREIGN PATENT DOCUMENTS 2334495 12/1975 France .
436092 9/1962 Switzerland .
2028230 8/1978 United Kingdom .

*Primary Examiner*—Robert C. Watson
*Attorney, Agent, or Firm*—Weingarten, Schurgin, Gagnebin & Hayes

[57] ABSTRACT

The clamping tool comprises two plates (1,2) held together by sets of nuts and bolts (4,5) with a precise spacing therebetween determined by spacers (6). In order to obviate the need to machine the tool elements after each infiltration operation due to deposit of infiltrating material on the exposed surfaces, the plate is provided with channels (9) extending along a contour of the contact zones of the spacers. The width of the channels is such that irrespective of a tolerance in the positioning of said blocking elements resulting from some play in assembling the elements forming the clamping tool, the edges delimiting the contacting surfaces of the spacers are always located entirely between an inner edge and an outer edge of their corresponding channel portion.

6 Claims, 4 Drawing Sheets

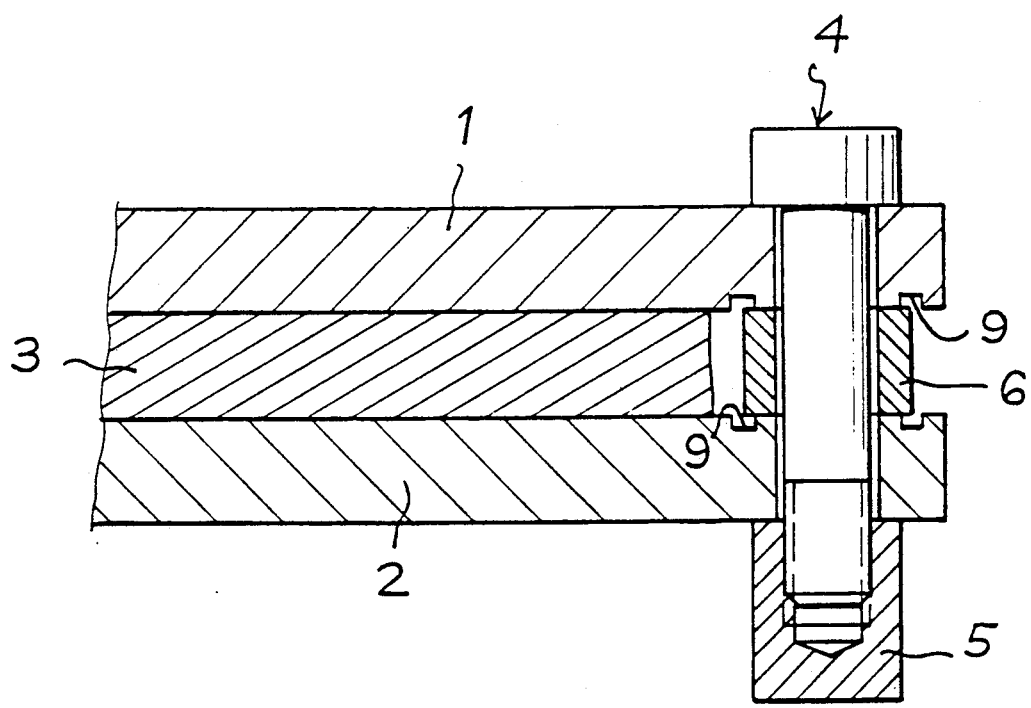
Fig_3

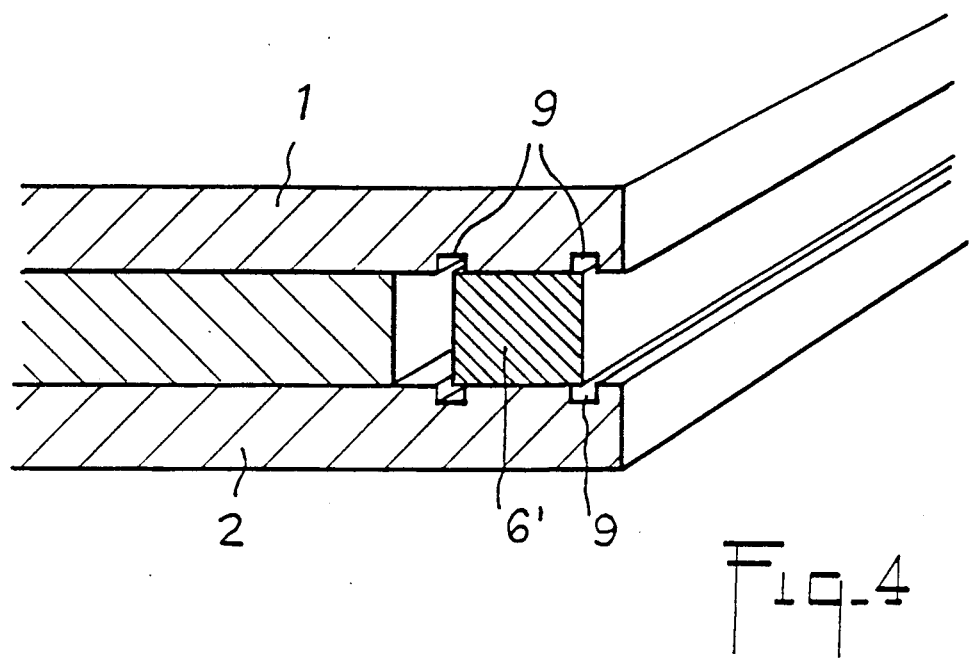
Fig_4
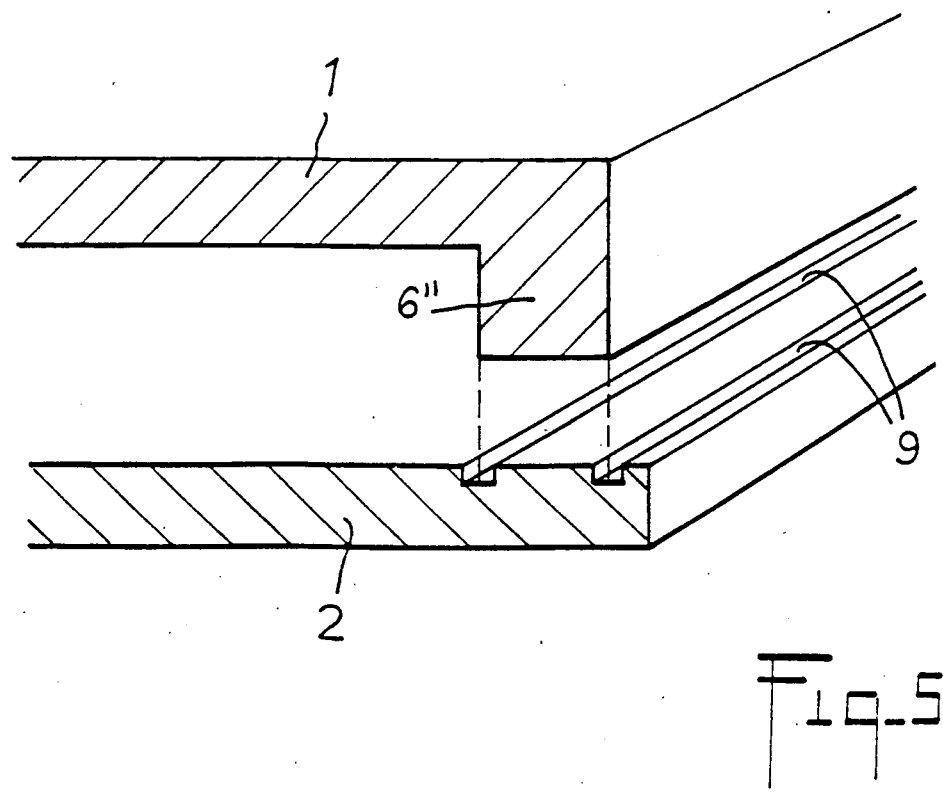
Fig_5

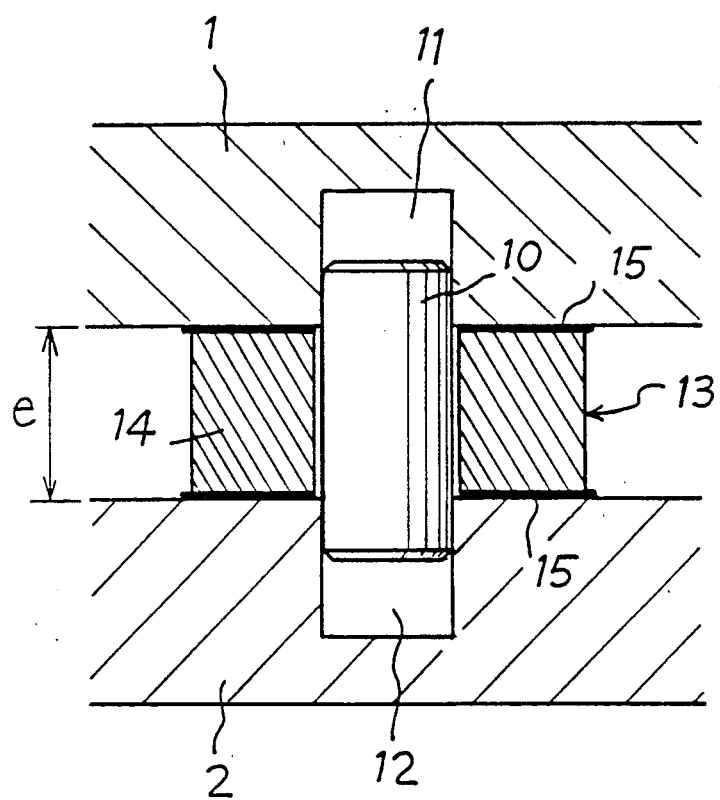
Fig_6

CLAMPING TOOL FOR CARRYING OUT A CHEMICAL VAPOR INFILTRATION OF A MATERIAL WITHIN A FIBROUS PREFORM DURING THE MANUFACTURE OF COMPOSITE PARTS

BACKGROUND OF THE INVENTION

1. Field of the Invention

The present invention relates to items of tooling for carrying out a chemical vapor infiltration of a material within a fibrous preform for the manufacture of composite parts. More particularly, the invention relates to a clamping tool comprising two plates for clamping a fibrous preform undergoing an infiltration process, said plates having ends overlapping from said fibrous preform, whereby said plates are held together with specified spacing therebetween determined by blocking elements provided in the region of said ends of said plates.

2. Prior art

When such a type of tool is used for the infiltration of a material within a fibrous preform, the infiltrating material forms a deposit throughout the surface of the tool, so creating an excess thickness that alters the dimensions of its constituent elements. It is therefore necessary, between each infiltration process, to machine at least a part of these elements in order to bring the critical clamping dimensions that determine the dimensions of the workpiece back to their nominal values.

This intermediate machining is required for each new utilization of the clamping tool and constitutes a substantial constraint, especially since the growing trend towards more and more complex workpieces and correspondingly complex tools makes this overhaul operation both difficult and expensive.

SUMMARY OF THE INVENTION WITH OBJECTS

An object of the present invention is to overcome the aforementioned drawbacks. According to the present invention, the ends of at least one of the plates present planar contact faces cooperating with said blocking elements and comprise channels extending along a contour of the contact zones of said blocking elements, the width of said channels being such that, irrespective of a tolerance in the positioning of said blocking elements resulting from some play in assembling the elements forming said clamping tool, edge portions of said blocking elements that delimit said contact zones are always located entirely between an inner edge and an outer edge of a corresponding channel portion.

By virtue of the above channels, the entire surface of each plate portion intended to come into contact with a blocking element remains free of any excess thickness arising from a deposition of infiltrating material in that region, after infiltration operation. The channels thus protect the geometrical reference surfaces of the tool and make it possible to reassemble the tool without the risk of having a blocking element coming to rest on the deposit resulting from a previous infiltration, instead of on the thrust surface of the plate. This feature considerably extends the interval between overhaul operations, these only being made necessary when the channels have become completely filled by successive deposits formed over plural infiltration processes.

In cases where the clamping tool is provided with centering pins to ensure an accurate positioning of the plates, wherein each pin is fixedly or removably mounted to one of the plates and passes through the gap separating the plates to engage inside a hollow formed in the other said plate, it is preferable to equip each pin with an annular element that becomes compressed between the two plates when the latter are brought to their specified separation. The annular element thus protects the pin through a sealing effect by keeping it free of any deposit during the infiltration process that could otherwise hinder the removal and insertion of the pin. This annular element can advantageously be composed of a substantially thick carbon fiber washer flanked on either side by a pair of thin metal washers, e.g. made of molybdenum.

The present invention is applicable to tools used for the infiltration of pyrolytic carbon or any other material that constitutes a matrix within a fibrous preform and is amenable to the chemical vapor infiltration, such as silicon carbide SiC.

BRIEF DESCRIPTION OF THE DRAWINGS

Further distinctive features and advantages of the invention will become more apparent from the following description with reference to the accompanying drawings, in which :

FIG. 3 illustrates such a clamping tool equipped with the improvements according to the present invention;

FIGS. 4 and 5 illustrate two alternative embodiments of a clamping tool according to the invention; and FIG. 6 illustrates a partial cross-section view of a clamping tool comprising a centering pin for the plates.

DETAILED DESCRIPTION OF THE PREFERRED EMBODIMENTS

Figure 1:
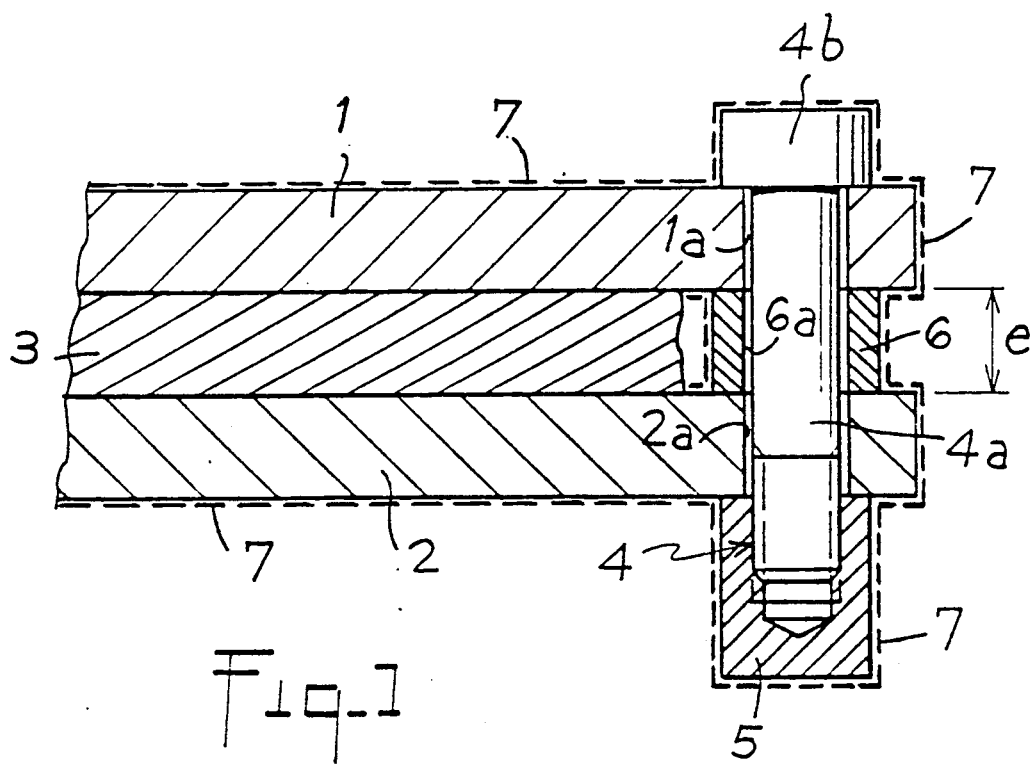
FIG. 1 is a partial cross-sectional view of a prior art clamping tool after an infiltration operation.

The clamping tool, which is partially illustrated in FIG. 1, is made of graphite elements. It comprises two plates 1, 2 between which is placed a preform 3 made of carbon fibers that are to be consolidated by infiltration of pyrolytic carbon to obtain a composite component.

The plates are drawn together at the overlapping edges of the fibrous preform 3 by clamping assemblies each comprising a bolt 4 and a nut 5 that screws onto the threaded end of the bolt after interposition of the blocking elements in the form of annular spacers. Each of the spacers engaged around the shaft 4a of a bolt 4 determines, by its thickness, i.e. the distance separating its two plane parallel annular faces, the separation e between the plates 1, 2. This separation e establishes the specified thickness of the composite workpiece being manufactured.

During the consolidation of the fibrous preform 3, the pyrolytic carbon not only infiltrates the latter, but is also deposited on all the exposed surfaces of the clamping tool. A deposit 7 is thus formed on the external faces of plates 1, 2, on the head 4b of each bolt 4, on a portion of the inner faces of plates 1, 2 surrounding the spacers 6, on the lateral surfaces of the latter, and on the corresponding nut 5. However, the following areas remain protected : the zones where the plates 1, 2 contact the planar thrust surfaces of the spacers 6 that form part of the clamping tool's geometrical reference surfaces, the surface around the shaft 4a of the bolts 4, the central opening of the spacers 6, and the holes formed at the ends of plates 1, 2 for the passage of the bolts 4.

Figure 2:
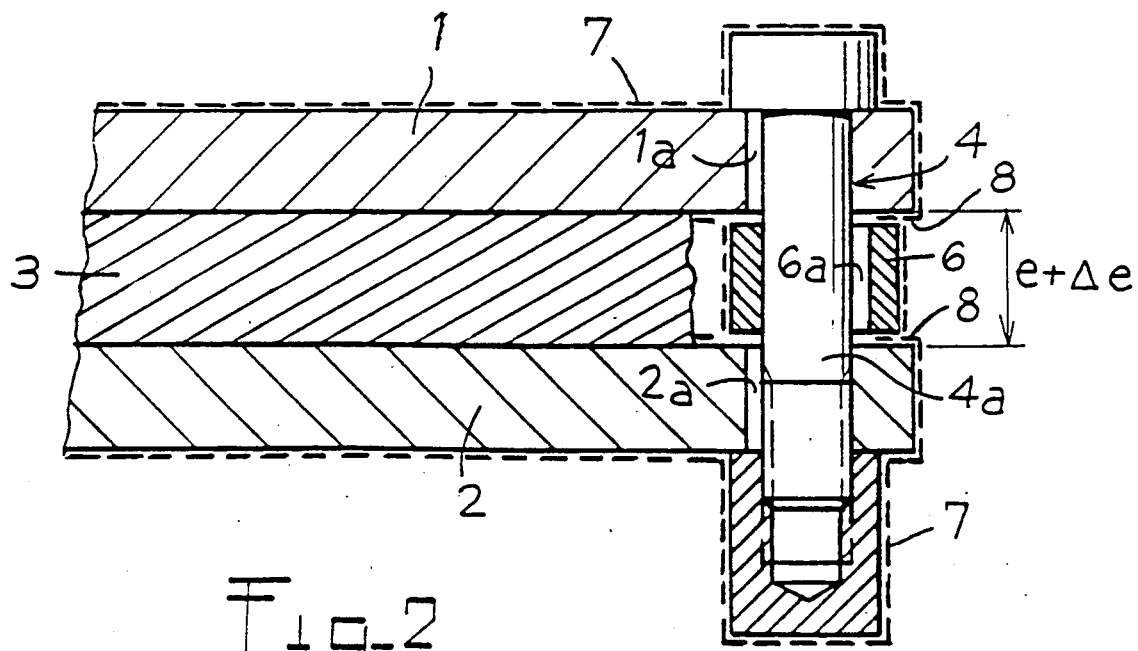
FIG. 2 illustrates the clamping tool of FIG. 1 after dismantling and reassembling for a new infiltration.

At the end of the infiltration process, the tool 1, 2, 4, 5, 6 is dismantled to allow the workpiece to be extracted, and is subsequently reassembled for the consolidation of another preform. As can be seen from FIG. 2, the radial play between the shaft 4a of a bolt 4 and the holes 1a, 2a, 6a of plates 1, 2 and the spacer 6, can cause a portion of deposited material 7 formed on the internal faces of the plates 1, 2 in the regions 8 around the spacer 6 to become interposed between these faces and the faces corresponding to the spacer 6 when the clamping tool is reassembled. This leads to an exaggerated spacing $e + \Delta e$ between the internal faces of the plates, giving rise to an incorrect thickness for the workpiece.

The clamping tool illustrated in FIG. 3 is designed to avoid such a possibility. An annular channel 9 is formed in each one of the internal faces of the plates 1, 2. Each channel surrounds the hole 1a, 2a of the respective plates 1, 2 along a path corresponding to the external contour of the spacer 6, and has a width such that, even when the above-mentioned radial play is taken into account, the peripheral edge of each contact face of the spacer 6 is always against the corresponding channel portion. In this way, the deposit 7 formed in each channel 9 cannot become interposed between the internal faces of the plates 1, 2 and the spacer 6, irrespective of the positioning of the latter between the plates. This remains true all the while the pyrolytic carbon deposits formed during successive infiltration operations have not filled in the channels 9.

FIG. 4 illustrates a variant in which the blocking elements are in the form of straights rods 6' having a rectangular cross-section, as opposed to annular elements. In this case, the channels 9 also extend linearly along the edges bordering the contact faces of the rods 6'.

In FIG. 5, the rods 6' are shown to form an integral part of one of the plates. In the present example, they are in the form of rectilinear edges 6'' belonging to plate 1, the assembly optionally being expendable. In this embodiment, only the other plate 2 has channels 9.

In order to ensure an accurate mutual positioning of the plates 1 and 2, the latter are provided with centering pins 10, one of which is shown in FIG. 6. Each pin is engaged in a conforming receiving cavity 11, 12, respectively provided in each of the opposite faces of the plates 1, 2. In order to prevent pyrolytic carbon from being deposited on the pins 10 and on the neighboring portions of the internal faces of the plates, each pin is surrounded by an annular sealing member 13 comprised of a carbon felt washer interposed between two washers 15 made of molybdenum foil (this metal is non polluting for the atmosphere of the furnace in which the tool is placed, resists to high temperatures and allows easy removal of the felt washers). When the plates 1, 2 are set at the spacing determined by the clamping faces, washer 14 is tightly compressed between the two plates and so provides an effective seal for protecting the pins 10. The latter thus remain uncontaminated from any unwanted deposits and can therefore be inserted and removed without difficulty.

What is claimed is:

1. A clamping tool for carrying out chemical vapor infiltration of a material within a fibrous preform during the manufacture of composite parts, said tool comprising:
    two plates for clamping a fibrous preform undergoing an infiltration process, said plates having confronting surfaces and including ends overlapping from said fibrous preform whereby said plates are held together with a specified spacing therebetween determined by blocking elements having a predetermined contour provided in the vicinity of said overlapping ends of said plates, said blocking elements contacting a confronting surface of at least one of said plates in a contact zone having generally the same contour as said blocking elements;
    wherein the overlapping ends of the confronting surface of the at least one including said contact zone further include channels extending along the contour of the contact zone of said blocking elements, said contact zone including peripheral edge portions disposed within a width of said channel defined by a channel inner edge and a channel outer edge; and
    the width of said channels being such that, irrespective of a tolerance in the positioning of said blocking elements resulting from some play in the assembling of the elements forming said clamping tool, the peripheral edge portions of said blocking elements that define said contact
    zone peripheral edge portions are always located entirely between an inner edge and an outer edge of a channel, said channels providing an area proximate the peripheral edge of the contact zone of said blocking elements in which said infiltrated material may accumulate, for maintaining the specified spacing between said two plates throughout a plurality of clampings and successive chemical vapor infiltration processes.

2. The clamping tool of claim 1, wherein said blocking elements are comprised of spacers interposed between confronting surfaces at the overlapping ends of said plates, both plates including channels in said confronting surfaces.

3. The clamping tool of claim 1, wherein one of said plates includes intergrally formed blocking elements having peripheral edge portions, and only the other said plate is provided with channels in its confronting surface along the contour of the contact zones of said blocking elements.

4. The clamping tool of claim 1, wherein centering pins are provided to ensure an accurate positioning of said plates, each pin mounted to one of said plates and passing through the specified spacing separating said plates to engage inside a hollow formed in the other said plate, and wherein each pin is equipped with an annular element which is compressed between said two plates when said plates are brought to their specified separation and so provides protection for the said pin by a sealing effect.

5. The clamping tool of claim 4, wherein said annular element is composed of a substantially thick carbon fiber washer flanked on either side by a pair of thin metal washers.

6. The clamping tool of claim 5 wherein said pair of thin metal washers include molybdenum.

* * * * *

UNITED STATES PATENT AND TRADEMARK OFFICE
CERTIFICATE OF CORRECTION

PATENT NO.    : 5,048,807
DATED         : September 17, 1991
INVENTOR(S)   : Manuel Martinez, et al.

It is certified that error appears in the above-identified patent and that said Letters Patent is hereby corrected as shown below:

Column 4, line 15, "one including" should read --one plate including--.

Signed and Sealed this

First Day of June, 1993

Attest:

MICHAEL K. KIRK

Attesting Officer    Acting Commissioner of Patents and Trademarks